United States Patent
Dupuy et al.

(10) Patent No.: US 9,837,526 B2
(45) Date of Patent: Dec. 5, 2017

(54) SEMICONDUCTOR DEVICE WTIH AN INTERCONNECTING SEMICONDUCTOR ELECTRODE BETWEEN FIRST AND SECOND SEMICONDUCTOR ELECTRODES AND METHOD OF MANUFACTURE THEREFOR

(71) Applicants: Philippe Dupuy, Toulouse (FR); Hubert Grandry, Espanes (FR)

(72) Inventors: Philippe Dupuy, Toulouse (FR); Hubert Grandry, Espanes (FR)

(73) Assignee: NXP USA, Inc., Austin, TX (US)

( * ) Notice: Subject to any disclaimer, the term of this patent is extended or adjusted under 35 U.S.C. 154(b) by 6 days.

(21) Appl. No.: 14/707,150

(22) Filed: May 8, 2015

(65) Prior Publication Data
US 2016/0163849 A1 Jun. 9, 2016

(30) Foreign Application Priority Data

Dec. 8, 2014 (WO) ................. PCT/IB2014/002946

(51) Int. Cl.
*H01L 29/78* (2006.01)
*H01L 29/66* (2006.01)
(Continued)

(52) U.S. Cl.
CPC .. *H01L 29/7804* (2013.01); *H01L 21/823475* (2013.01); *H01L 21/823487* (2013.01);
(Continued)

(58) Field of Classification Search
CPC ........................ H01L 29/7804; H01L 27/088
See application file for complete search history.

(56) References Cited

U.S. PATENT DOCUMENTS

| 5,420,451 A | 5/1995 | Williams et al. |
| 5,488,862 A | 2/1996 | Neukermans et al. |

(Continued)

FOREIGN PATENT DOCUMENTS

| EP | 1887698 A2 | 2/2008 |
| EP | 2533246 A1 | 12/2012 |

(Continued)

OTHER PUBLICATIONS

Robb, F. et al., "A new p-channel bidirectional trench power MOSFET for battery charging and protection," Proceedings of the 22nd International Symposium on Power Semiconductor Devices & ICs, Hiroshima; pp. 405-408.

(Continued)

*Primary Examiner* — Lex Malsawma
*Assistant Examiner* — Xia Cross
(74) *Attorney, Agent, or Firm* — Charlene R. Jacobsen

(57) ABSTRACT

A semiconductor product comprising: a first semiconductor electrode, a second semiconductor electrode and an interconnecting semiconductor electrode defining a third semiconductor electrode; a first switch, between the first semiconductor electrode and the third semiconductor electrode, provided by a first vertical insulated-gate field-effect-transistor; and a second switch, between the second semiconductor electrode and the third semiconductor electrode, provided by a second vertical insulated-gate field-effect-transistor, wherein the interconnecting semiconductor electrode interconnects the first vertical insulated gate field-effect-transistor and the second vertical insulated gate field-effect-transistor.

14 Claims, 11 Drawing Sheets

(51) Int. Cl.
  *H01L 27/07* (2006.01)
  *H01L 21/8234* (2006.01)
  *H01L 29/423* (2006.01)
  *H01L 27/088* (2006.01)

(52) U.S. Cl.
  CPC ........ *H01L 27/0727* (2013.01); *H01L 27/088* (2013.01); *H01L 29/4236* (2013.01); *H01L 29/66734* (2013.01); *H01L 29/7813* (2013.01)

(56) References Cited

U.S. PATENT DOCUMENTS

| | | | |
|---|---|---|---|
| 5,682,050 | A | 10/1997 | Williams |
| 5,767,733 | A | 6/1998 | Grugett |
| 5,770,883 | A | 6/1998 | Mizuno et al. |
| 5,850,042 | A | 12/1998 | Warren |
| 5,914,801 | A | 6/1999 | Dhuler et al. |
| 5,945,708 | A | 8/1999 | Tihanyi |
| 6,043,965 | A | 3/2000 | Hazelton et al. |
| 6,049,108 | A | 4/2000 | Williams et al. |
| 6,096,608 | A | 8/2000 | Williams |
| 6,215,137 | B1 | 4/2001 | Suzuki et al. |
| 6,433,401 | B1 | 8/2002 | Clark et al. |
| 6,650,520 | B2 | 11/2003 | He |
| 6,781,195 | B2 | 8/2004 | Wu et al. |
| 6,943,408 | B2 | 9/2005 | Wu et al. |
| 7,019,231 | B2 | 3/2006 | Ishikawa et al. |
| 7,280,014 | B2 | 10/2007 | Potter |
| 7,282,406 | B2 | 10/2007 | Grivna et al. |
| 7,283,343 | B2 | 10/2007 | Grose et al. |
| 7,297,603 | B2 | 11/2007 | Robb et al. |
| 7,352,036 | B2 | 4/2008 | Grebs et al. |
| 7,508,277 | B2 | 3/2009 | Kuo et al. |
| 7,537,970 | B2 | 5/2009 | Robb et al. |
| 7,605,435 | B2 | 10/2009 | Anderson et al. |
| 7,807,536 | B2 | 10/2010 | Sreekantham et al. |
| 7,910,409 | B2 | 3/2011 | Robb et al. |
| 8,049,287 | B2 | 11/2011 | Combi et al. |
| 8,049,568 | B2 | 11/2011 | Youssef et al. |
| 8,101,969 | B2 | 1/2012 | Robb et al. |
| 8,120,984 | B2 | 2/2012 | Huang et al. |
| 8,247,867 | B2 | 8/2012 | Nakata et al. |
| 8,269,263 | B2 | 9/2012 | Li et al. |
| 8,304,275 | B2 | 11/2012 | Schlarmann et al. |
| 8,431,989 | B2 | 4/2013 | Bhalla et al. |
| 8,541,833 | B2 | 9/2013 | Schulze et al. |
| 8,642,425 | B2 | 2/2014 | Burke et al. |
| 8,648,432 | B2 | 2/2014 | Haeusler |
| 8,653,587 | B2 | 2/2014 | Hshieh |
| 8,907,394 | B2 | 12/2014 | Hossain |
| 8,947,156 | B2 | 2/2015 | Stultz et al. |
| 9,123,559 | B2 | 9/2015 | Meiser |
| 9,159,786 | B2 | 10/2015 | Chen |
| 9,269,779 | B2 | 2/2016 | Deng et al. |
| 9,443,845 | B1 | 9/2016 | Stefanov |
| 9,446,940 | B2 | 9/2016 | Dawson et al. |
| 9,458,008 | B1 | 10/2016 | Dawson et al. |
| 9,472,662 | B2 | 10/2016 | Stefanov |
| 2001/0043112 | A1 | 11/2001 | Voldman |
| 2005/0172717 | A1 | 8/2005 | Wu et al. |
| 2006/0267161 | A1 | 11/2006 | Thompson et al. |
| 2007/0004116 | A1 | 1/2007 | Hshieh |
| 2007/0108511 | A1* | 5/2007 | Hirler .................. H01L 29/407 257/328 |
| 2007/0205431 | A1 | 9/2007 | Robb et al. |
| 2008/0016683 | A1 | 1/2008 | Brida et al. |
| 2008/0023473 | A1 | 1/2008 | Spyros et al. |
| 2008/0111642 | A1 | 5/2008 | Bohorquez |
| 2008/0121995 | A1 | 5/2008 | Anderson et al. |
| 2008/0290430 | A1 | 11/2008 | Mahadevan et al. |
| 2009/0261446 | A1 | 10/2009 | Gogoi |
| 2010/0019393 | A1 | 1/2010 | Hsieh et al. |
| 2010/0031077 | A1 | 2/2010 | Swoboda |
| 2010/0187602 | A1 | 7/2010 | Woolsey et al. |
| 2010/0315938 | A1 | 12/2010 | Ascanio et al. |
| 2011/0127573 | A1* | 6/2011 | Robb .............. H01L 21/823487 257/121 |
| 2012/0025305 | A1 | 2/2012 | Takeda |
| 2012/0049187 | A1 | 3/2012 | Haruyama et al. |
| 2012/0083075 | A1 | 4/2012 | Robb et al. |
| 2012/0175635 | A1 | 7/2012 | Weis et al. |
| 2012/0326227 | A1 | 12/2012 | Burk et al. |
| 2013/0187196 | A1* | 7/2013 | Kadow ................. H01L 27/088 257/140 |
| 2013/0214365 | A1 | 8/2013 | Schlarmann et al. |
| 2013/0249602 | A1 | 9/2013 | Mauder et al. |
| 2013/0344667 | A1 | 12/2013 | Qin et al. |
| 2014/0009212 | A1 | 1/2014 | Altunkilic et al. |
| 2014/0021484 | A1 | 1/2014 | Siemieniec et al. |
| 2014/0084362 | A1 | 3/2014 | Schloesser et al. |
| 2014/0252512 | A1 | 9/2014 | Yang et al. |
| 2014/0367773 | A1 | 12/2014 | Poelzl |
| 2015/0028416 | A1 | 1/2015 | Zundel et al. |
| 2015/0069610 | A1 | 3/2015 | Grivna et al. |
| 2015/0102403 | A1 | 4/2015 | Kuruc |
| 2015/0115387 | A1 | 4/2015 | Buckley et al. |
| 2015/0145030 | A1 | 5/2015 | Meiser et al. |
| 2015/0162324 | A1 | 6/2015 | Mauder |
| 2015/0194915 | A1* | 7/2015 | Mulliken ................ H02P 6/085 318/400.29 |
| 2016/0051131 | A1 | 2/2016 | Jeong et al. |
| 2016/0126348 | A1 | 5/2016 | Deng et al. |
| 2016/0159642 | A1 | 6/2016 | Hooper et al. |

FOREIGN PATENT DOCUMENTS

| | | |
|---|---|---|
| WO | 95/30277 A1 | 11/1995 |
| WO | 00/19540 A1 | 4/2000 |
| WO | 2015028838 A1 | 3/2015 |

OTHER PUBLICATIONS

Final Office Action dated Feb. 19, 2016 for U.S. Appl. No. 14/564,340, 15 pages.
Non-Final Office Action dated Jun. 16, 2016 for U.S. Appl. No. 14/564,340, 15 pages.
Non-Final Office Action dated Sep. 14, 2015 for U.S. Appl. No. 14/564,340, 13 pages.
Arzumanyan, A. et al. "Flip Chip Power MOSFET: A New Wafer Scale Packaging Technique," Proceedings of 2001 International Symposium on Power Semiconductor Devices and I.C.'s, Osaka, JP; pp. 251-254; Jun. 2001.
Sawada, M. et al., "High side n-channel and bidirectional Trench Lateral Power MOSFETs on one chip for DCDC converter I.C.s," Proceedings of the 20th International Symposium on Power Semiconductor Devices and I.C.s, Orlando, FL; May 2008.
Notice of Allowance dated Dec. 7, 2016 for U.S. Appl. No. 14/912,346, 9 pages.
Notice of Allowance dated Oct. 3, 2016 for U.S. Appl. No. 14/912,346, 9 pages.
Final Office Action dated Jun. 16, 2016 for U.S. Appl. No. 14/506,037, 8 pages.
Non-Final Office Action dated Jan. 21, 2016 for U.S. Appl. No. 14/506,037, 8 pages.
Notice of Allowance dated Jul. 29, 2016 for U.S. Appl. No. 14/506,037, 8 pages.
Extended European Search Report for corresponding EP 15199239.3, dated Jul. 7, 2016, 9 pages.
Notice of Allowance dated Aug. 1, 2016 for U.S. Appl. No. 14/870,311, 5 pages.
Notice of Allowance dated May 16, 2016 for U.S. Appl. No. 14/870,311, 8 pages.
Notice of Allowance dated Jun. 13, 2016 for U.S. Appl. No. 14/870,333, 13 pages.
Notice of Allowance dated Sep. 8, 2016, 2016 for U.S. Appl. No. 14/870,333, 9 pages.
Restriction Requirement dated Mar. 22, 2016 for U.S. Appl. No. 14/870,333, 6 pages.

(56) References Cited

OTHER PUBLICATIONS

Ex parte Quayle Action dated Jun. 24, 2016 for U.S. Appl. No. 14/658,598, 5 pages.
Notice of Allowance dated Aug. 10, 2016 for U.S. Appl. No. 14/658,598, 5 pages.
Restriction Requirement dated Mar. 1, 2016 for U.S. Appl. No. 14/658,598, 5 pages.
Non-Final Rejection dated Dec. 7, 2016 for U.S. Appl. No. 15/132,855 21 pages.
U.S. Appl. No. 14/994,197, filed Jan. 13, 2016.
Notice of Allowance dated Apr. 17, 2017 for U.S. Appl. No. 15/132,855, 18 pages.

* cited by examiner

SEMICONDUCTOR DEVICE WTIH AN INTERCONNECTING SEMICONDUCTOR ELECTRODE BETWEEN FIRST AND SECOND SEMICONDUCTOR ELECTRODES AND METHOD OF MANUFACTURE THEREFOR

CROSS REFERENCE TO RELATED APPLICATION(S)

The present application claims priority to International Patent Application No. PCT/IB2014/002946, entitled "SEMICONDUCTOR DEVICE AND METHOD FO MANUFACTURE THEREFOR," filed on Dec. 8, 2014, the entirety of which is herein incorporated by reference.

FIELD OF THE INVENTION

This invention relates to a semiconductor device and a method of manufacture therefor.

BACKGROUND OF THE INVENTION

Standard power transistors have a low blocking voltage in one direction, making them unidirectional devices. Consequently, if a bi-directional switch is required it is typically implemented using two separate serially coupled power MOSFETs in back to back configuration. The separate MOSFETs are formed on separate semiconductor dice, and often housed in separate packages, which results in a high manufacturing cost and a large area occupied on a circuit board. This may be problematic in, for example, a H-bridge arrangement where multiple power transistors are used.

SUMMARY OF THE INVENTION

The present invention provides a semiconductor product and methods as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated examples may for the most part, be implemented using techniques, processes and components known to those skilled in the art, details will not be explained in any greater extent than that considered necessary for the understanding and appreciation of the underlying concepts of the examples set forth herein and in order not to obfuscate or distract from the teachings herein.

Figure 1:
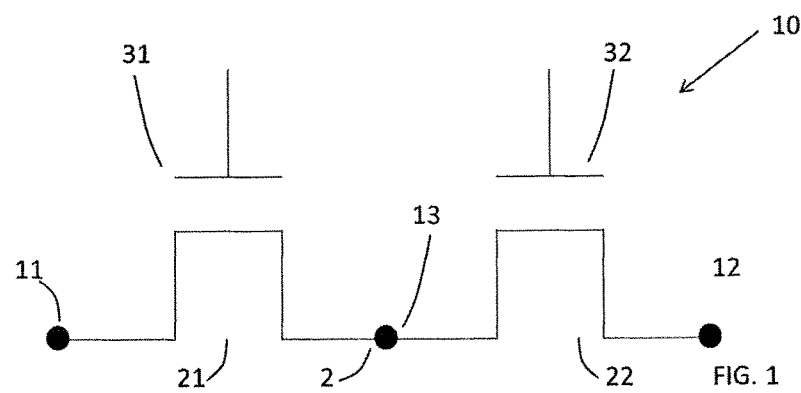
FIG. 1 is a schematic view of an example of a semiconductor product 10 comprising first and second vertical insulated-gate field-effect-transistors.

FIG. 1 is a schematic view of an example of a semiconductor product 10 comprising: a first semiconductor electrode 11, a second semiconductor electrode 12 and an interconnecting semiconductor electrode 2 defining a third semiconductor electrode 13; a first switch 21, between the first semiconductor electrode 11 and the third semiconductor electrode 13, provided by a first vertical insulated-gate field-effect-transistor 31; and a second switch 22, between the second semiconductor electrode 12 and the third semiconductor electrode 13, provided by a second vertical insulated-gate field-effect-transistor 32. The interconnecting semiconductor electrode 2 interconnects the first vertical insulated gate field-effect-transistor 31 and the second vertical insulated gate field-effect-transistor 32.

The common interconnecting semiconductor electrode 2 allows a single compact semiconductor product 10 that integrates both the first switch 21 and the second switch 22 into a single semiconductor assembly.

Figure 2A:
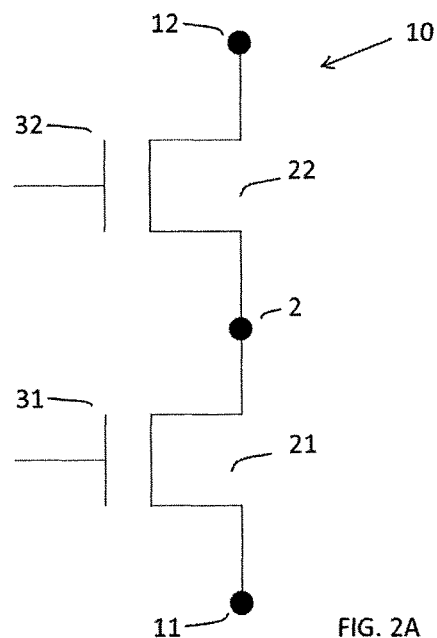
FIG. 2A is a schematic view of an example of the semiconductor product in which a first semiconductor electrode and a second semiconductor electrode are configured for electrical power input.

FIG. 2A is a schematic view of an example of the semiconductor product 10 in which the first semiconductor electrode 11 and the second semiconductor electrode 12 are configured to receive electrical power by the application of a potential difference between the first semiconductor electrode 11 and the second semiconductor electrode 12. The interconnecting semiconductor electrode 2 defining the third semiconductor electrode 13 is configured to supply electrical power to a load by providing an electric current.

Figure 2B:
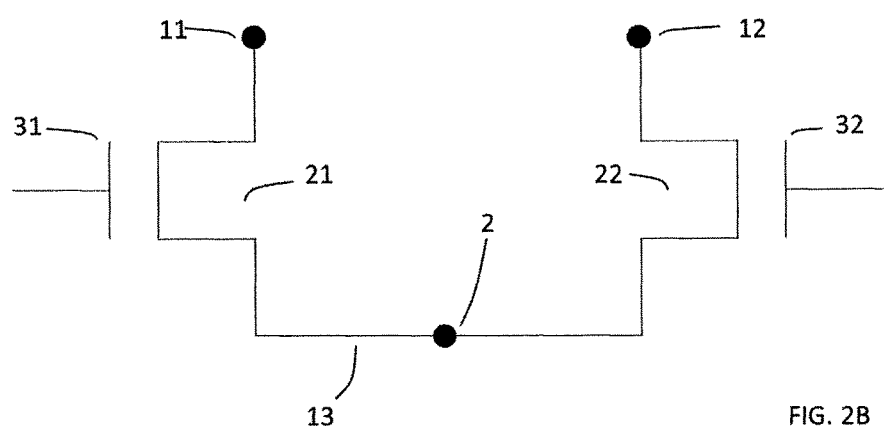
FIG. 2B is a schematic view of an example of the semiconductor product in which a first semiconductor electrode and a second semiconductor electrode are configured for electrical power output.

FIG. 2B is a schematic view of an example of the semiconductor product 10 in which the first semiconductor electrode 11 and the second semiconductor electrode 12 are configured to supply electrical power by the application of a potential difference between the first semiconductor electrode 11 and the second semiconductor electrode 12. The interconnecting semiconductor electrode 2 defining the third semiconductor electrode 13 is configured to provide electrical power by sourcing or sinking an electric current.

Figure 3A:
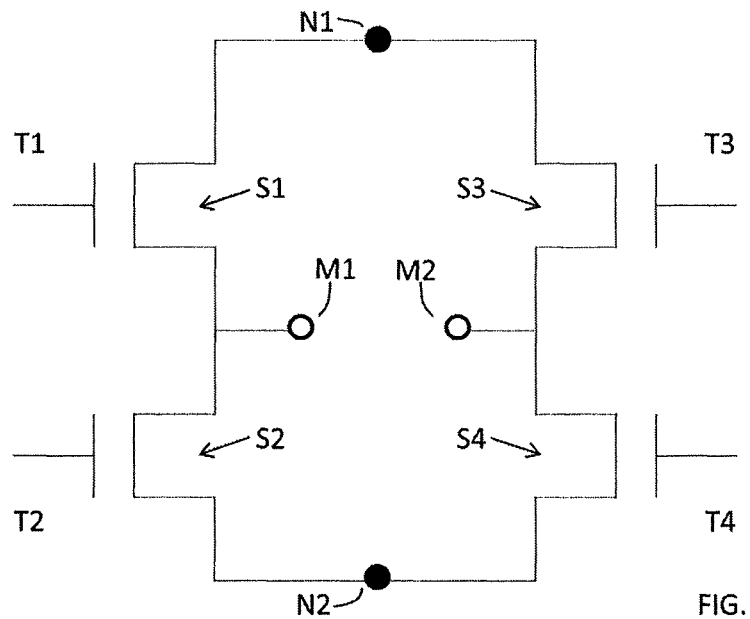
FIG. 3A is a schematic view of an example of a H-Bridge.

FIG. 3A is a schematic view of an example of a H-bridge comprising a first node pair comprising node N1 and node N2 and a second node pair comprising node M1 and node M2. A switch S1 comprising a field effect transistor (FET) T1 is positioned between node N1 and node M1. A switch S2 comprising a field effect transistor (FET) T2 is positioned between node M1 and node N2. A switch S3 comprising a field effect transistor (FET) T3 is positioned between node N1 and node M2. A switch S4 comprising a field effect transistor (FET) T4 is positioned between node M2 and node N2.

As is known to the person skilled in the art, a potential difference may be applied between nodes N1 and N2. The switches S1, S2, S3, 34 are switched on or off to control current flow between the node M1 and node M2. For example if both FETs T1 and T4 are on and both FETs T2 and T3 are off then an electric current may flow from node M1 to node M2. For example if both FETs T2 and T3 are on and both FETs T1 and T4 are off then an electric current may flow from node M2 to node M1

Thus if a particular potential difference is applied between node N1 and node N2, the direction of the electric current between the node M1 and node M2 may be controlled by controlling whether the FETs T1, T2, T3, T4 are on or off.

Referring to FIG. 2A and FIG. 3A, it will be appreciated that the node N1, FET T1, node M1, FET T2 and node N2 in FIG. 3A (the left-side) may correspond with respectively the first semiconductor electrode 11, the first vertical insulated-gate field-effect-transistor 31, the interconnecting semiconductor electrode 2 defining the third semiconductor electrode 13, the second vertical insulated-gate field-effect-transistor 32 and the second semiconductor electrode 12 of FIG. 2A.

Referring to FIG. 2A and FIG. 3A, it will be appreciated that the node N1, FET T3, node M2, FET T4 and node N2 in FIG. 3A (the right-side) may correspond with respectively the first semiconductor electrode 11, the first vertical insulated-gate field-effect-transistor 31, the interconnecting semiconductor electrode 2 defining the third semiconductor electrode 13, the second vertical insulated-gate field-effect-transistor 32 and the second semiconductor electrode 12 of FIG. 2A.

Referring to FIG. 2B and FIG. 3A, it will be appreciated that the node M1, FET T2, node N2, FET T4 and node M2 in FIG. 3A (the bottom-side) may correspond with respectively the first semiconductor electrode 11, the first vertical insulated-gate field-effect-transistor 31, the interconnecting semiconductor electrode 2 defining the third semiconductor electrode 13, the second vertical insulated-gate field-effect-transistor 32 and the second semiconductor electrode 12 of FIG. 2A.

Referring to FIG. 2B and FIG. 3A, it will be appreciated that the node M1, FET T1, node N1, FET T3 and node M2 in FIG. 3A (the top-side) may correspond with respectively the first semiconductor electrode 11, the first vertical insulated-gate field-effect-transistor 31, the interconnecting semiconductor electrode 2 defining the third semiconductor electrode 13, the second vertical insulated-gate field-effect-transistor 32 and the second semiconductor electrode 12 of FIG. 2A.

Figure 3B:
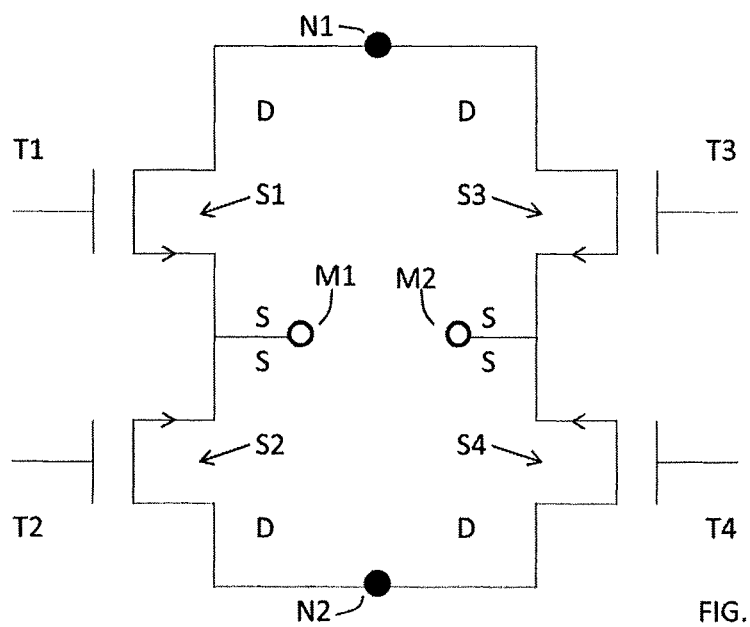
FIG. 3B is a schematic view of an example of the H-bridge shown in FIG. 3A, in which the FETs have the same channel type.

FIG. 3B is a schematic view of an example of the H-bridge shown in FIG. 3A, in which the FET T1, FET T2, FET T3 and FET T4 have the same channel type and the FET T2 and FET T4 are bi-directional. It should be noted that each of the switches S1, S2, S3, S4 consists of only a single transistor, respectively T1, T2, T3 and T4 and no additional transistors or diodes are required. In this example but not necessarily all examples they are all n-channel type. That is, as shown in FIG. 4 the vertical insulated-gate field-effect-transistors have n-type sources and drains 124, 120 and p-type body 122.

Figure 4:
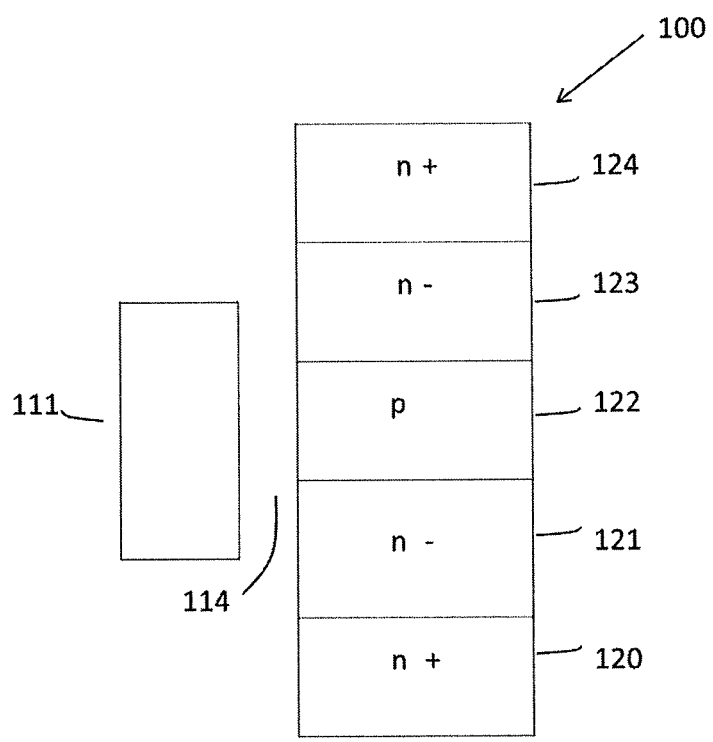
FIG. 4 is a schematic view of a vertical insulated-gate field-effect-transistor.

FIG. 4 is a schematic view of a vertical insulated-gate field-effect-transistor 100. A FET 100 of this type is suitable for use as the first vertical insulated-gate field-effect-transistor 31. A FET 100 of this type is suitable for use as the second vertical insulated-gate field-effect-transistor 31. A FET 100 of this type is suitable for use as any of FETs T1, T2, T3, T4.

The vertical insulated-gate field-effect-transistor 100 comprises a first current electrode 120 which forms the first semiconductor electrode 11 and a second current electrode 124 which forms the second semiconductor electrode 12. In the following description, the first current electrode 120 will be referred to as first semiconductor electrode 120 and the second current electrode 124 will be referred to as the second semiconductor electrode 124 to maintain continuity.

The first semiconductor electrode 120 is connected via a first semiconductor drift region 121 to a semiconductor body 122. The second semiconductor electrode 124 is connected via a second semiconductor drift region 123 to the semiconductor body 122. The first semiconductor electrode 120, first semiconductor drift region 121, semiconductor body 122, second semiconductor drift region 123 and second semiconductor electrode 124 are stacked such that access to the first semiconductor electrode 120 and the second semiconductor electrode 124 is from different and opposing sides of the semiconductor product 10.

The first semiconductor electrode 120 and the first semiconductor drift region 121 have a first conductivity type. The second semiconductor electrode 124 and the second semiconductor drift region 123 have a first conductivity type. The body 122 has a second conductivity type different to the first conductivity type.

The discontinuity in Fermi Energy levels between the first semiconductor drift region 121 and the body 122 creates a first junction diode 50. The discontinuity in Fermi Energy levels between the second semiconductor drift region 123 and the body 122 creates a second junction diode 52.

Figures 5A, 5B, 5C:
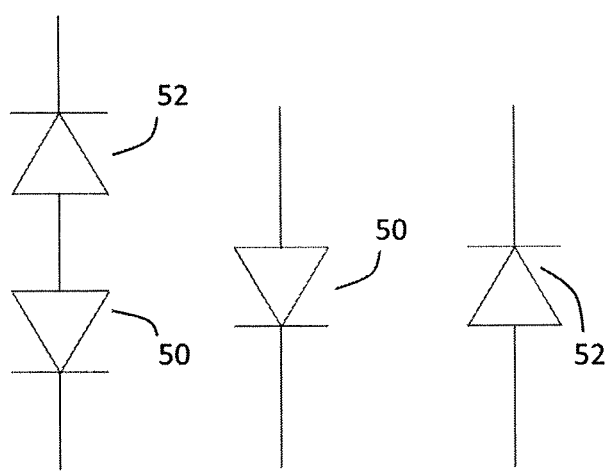
FIGS. 5A, 5B and 5C are a schematic views of the first junction diode 50 and the second junction diode 52 used during operation of the vertical insulated-gate field-effect-transistor to control electrical current flow.

In the example shown the first semiconductor drift region 121 is n-type and the body 122 is p-type and the first junction diode 50 enables current flow from body 122 to the first semiconductor drift region 121 and prevents current flow to the body 122 from the first semiconductor drift region 121. The second semiconductor drift region 123 is n-type and the second junction diode 52 enables current flow from body 122 to the second semiconductor drift region 123 and prevents current flow to the body 122 from the second semiconductor drift region 123. FIG. 5A is a schematic view of the first junction diode 50 and the second junction diode 52, which is in electrical series with and in an opposite sense to the first junction diode 50.

A vertically extending gate electrode 111 is adjacent the body 122 and separated from the body 122 by an insulator 114.

Application of a gate voltage above a threshold voltage disables one or both of the first diode 50 and second diode 52 allowing current flow.

If the body 122 and the first semiconductor drift region 121 are held at the same potential the first diode 50 is not disabled by the gate potential. In this case, the gate can enable current flow from the second drift region 123 to the body 122 while the first diode can prevent current flow from the first drift region 121 to the body 122, as shown in FIG. 5B.

If the body 122 and the second semiconductor drift region 123 are held at the same potential the second diode 52 is not disabled by the gate potential. In this case, the gate can enable current flow from the first drift region 121 to the body 122 while the second diode can prevent current flow from the second drift region 123 to the body 122, as shown in FIG. 5C.

Figure 6A:
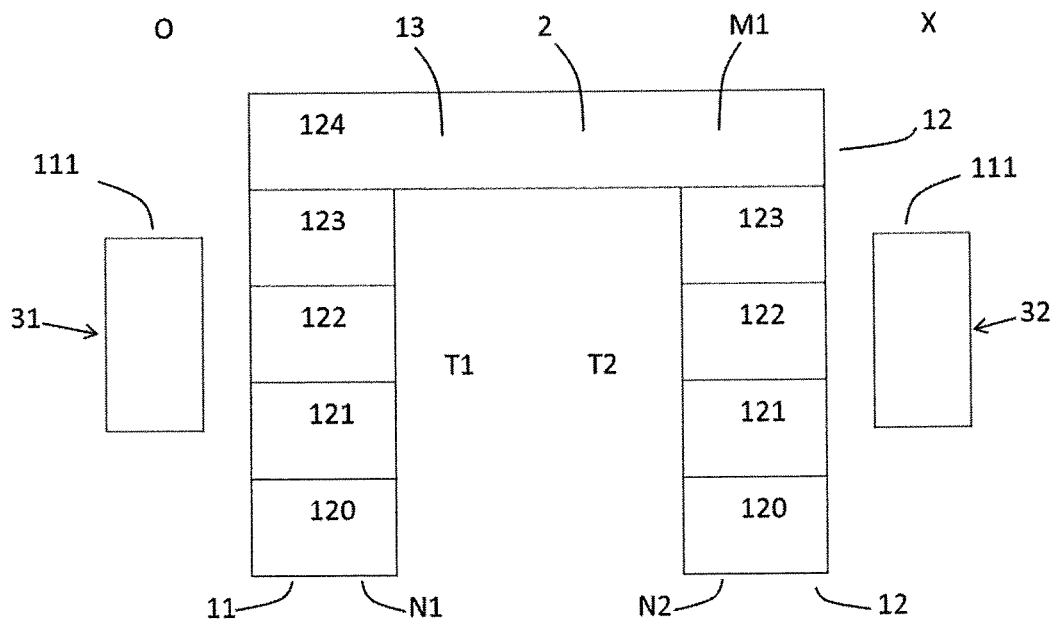
FIGS. 6A, 6B and 6C show the use of vertical insulated-gate field-effect-transistors as illustrated in FIG. 4 in manufacturing a H-bridge as illustrated in FIG. 3B.
Figure 6B:
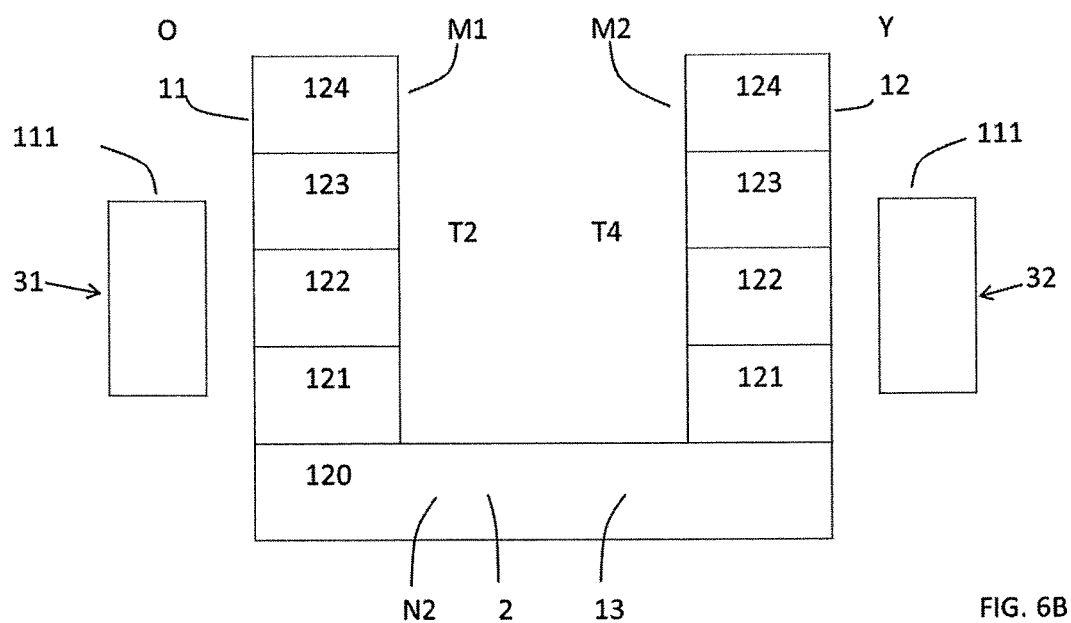
Figure 6C:
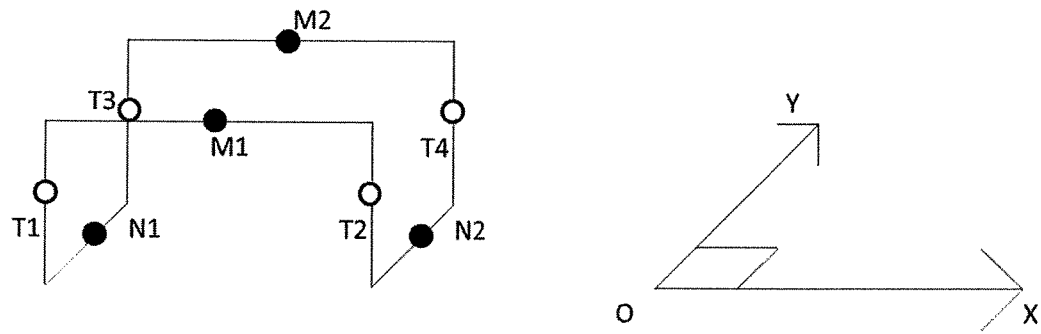

FIGS. 6A, 6B and 6C show the use of vertical insulated-gate field-effect-transistors 100 as illustrated in FIG. 4 in manufacturing a H-bridge as illustrated in FIG. 3B. FIG. 6A illustrates a cross-section O-X through node N1, FET T1, node M1, FET T2 and node N2. FIG. 6B illustrates a cross-section O-Y, orthogonal to the cross-section O-Y, through node M1, FET T2, node N2, FET T4 and node M2. FIG. 6C illustrates a three-dimensional relationship between node N1, FET T1, node M1, FET T2, node N2, FET T4, node M2, FET T3.

In FIG. 6A, the FET T1 and the FET T2 share a common current (source) electrode 124 as node M1. This electrode may be formed as a planar region of commonly doped semiconductor.

It will be appreciated that although FIG. 6A illustrates a cross-section O-X through node N1, FET T1, node M1, FET T2 and node N2, there may be an equivalent cross-section through node N1, FET T3, node M2, FET T4 and node N2.

In FIG. 6B, the FET T2 and the FET T4 share a common current (drain) electrode 120 as node M2. This electrode is formed as a planar region of commonly doped semiconductor.

It will be appreciated that although FIG. 6B illustrates a cross-section O-Y through node M1, FET T2, node N2, FET T4 and node M2 there may be an equivalent cross-section through node M1, FET T1, node N1, FET T3 and node M2.

It will be appreciated from FIG. 6C that nodes M1, M2 may be accessible from a first side of the semiconductor product 10, while the nodes N1, N2 are accessible from another second side, opposing the first side. It will be appreciated that 'vertical' is the direction separating the first side and second side and will change its actual orientation with respect to a fixed reference such as the Earth as the orientation of the semiconductor product 10 changes with respect to that reference.

The nodes N1, N2, M1, M2 may be accessible because they are at a surface of the semiconductor product 10 or because conductive interconnects, galvanically connected to the respective nodes, are at an exterior of the semiconductor product 10.

Referring to FIGS. 6A and 6B, it will be appreciated that the interconnecting electrode 13 is a doped semiconductor electrode, the first semiconductor electrode 11 and second semiconductor electrode 12 are distinct, doped portions of the same semiconductor material and only appropriately doped portions of semiconductor material separate vertically the first semiconductor electrode 11 and the interconnecting semiconductor electrode 13 and only appropriately doped portions of semiconductor material separate vertically the second semiconductor electrode 12 and the interconnecting semiconductor electrode 13.

The vertical insulated-gate field-effect-transistors described in the preceding paragraphs may be bidirectional power metal-oxide-semiconductor field-effect-transistors as described below.

The semiconductor product 10 may be manufactured by: providing, using doped semiconductor, an interconnecting semiconductor electrode; providing, using doped semiconductor, a first vertical insulated-gate field-effect-transistor 21 (T2/T1) that has an interconnecting semiconductor electrode 13 (N2/M1) as a first current electrode (drain/source) and a second vertical insulated-gate field-effect-transistor 22 (T4/T2) that has the interconnecting semiconductor electrode 13 (N2/M1) as a first current electrode (drain/source), the interconnecting electrode 13 (N2/M1) interconnecting the first vertical insulated gate field-effect-transistor 21 (T2/T1) and the second vertical insulated gate field-effect-transistor 22 (T4/T2); and providing, using doped semiconductor, a first semiconductor electrode 11 (M1/N1) and a second semiconductor electrode 12 (M2/N2), wherein the first semiconductor electrode 11 (M1/N1) forms a second current electrode (source/drain) of the first vertical insulated-gate field-effect-transistor 21 (T2/T1) and the second semiconductor electrode 12 (M2/N2) forms a second current electrode (source/drain) of the second vertical insulated-gate field-effect-transistor 22 (T4/T2).

The method may further comprise: providing, using doped semiconductor, a second interconnecting semiconductor electrode (N1/M2) defining a semiconductor electrode (drain/source); providing, using doped semiconductor, a third vertical insulated-gate field-effect-transistor (T3/T4) that has the second interconnecting semiconductor electrode (N1/M2) as a first current electrode (drain/source) and a fourth vertical insulated-gate field-effect-transistor (T1/T3) that has the second interconnecting semiconductor electrode (N1/M2) as a first current electrode (drain/source), the second interconnecting electrode (N1/M2) interconnecting the third vertical insulated gate field-effect-transistor (T3/T4) and the fourth vertical insulated gate field-effect-transistor (T1/T3); wherein providing, using doped semiconductor, the first semiconductor electrode (M1/N1) forms a second current electrode (source/drain) of the fourth vertical insulated-gate field-effect-transistor (T1/T3) and a second current electrode (source/drain) of the first vertical insulated-gate field-effect-transistor (T2/T1) and wherein providing, using doped semiconductor, the second semiconductor electrode (M2/N2) forms a second current electrode (source/drain) of the third vertical insulated-gate field-effect-transistor (T3/T4) and a second current electrode (source/drain) of the second vertical insulated-gate field-effect-transistor (T4/T2).

Figure 7:
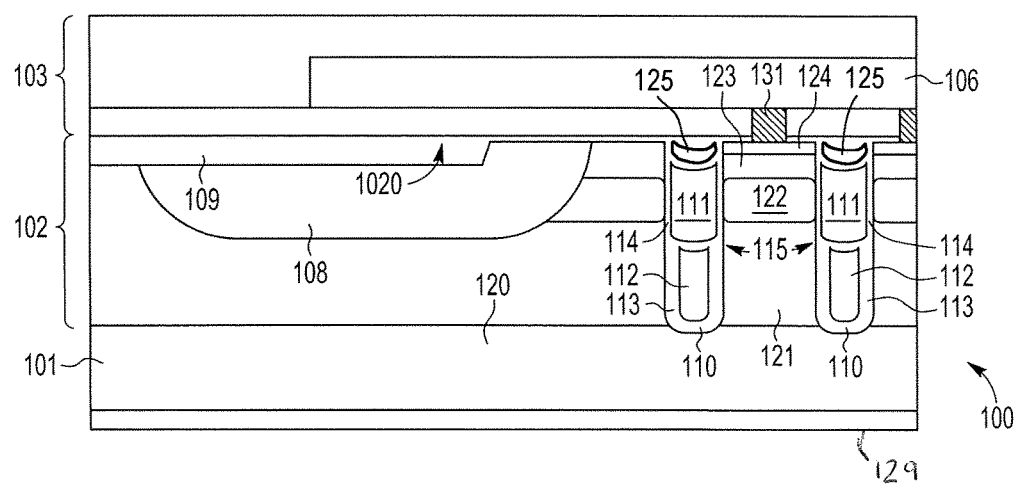
FIG. 7 is a vertical sectional view of a part of a vertical insulated-gate field-effect-transistor.

FIG. 7 shows a bi-directional trench field effect power transistor 100, similar to that shown in FIG. 4, that comprises a first semiconductor electrode 120 and a second semiconductor electrode 106 separated by at least a body 122.

An FET 100 of this type is suitable for use as the first vertical insulated-gate field-effect-transistor 31. A FET 100 of this type is suitable for use as the second vertical insulated-gate field-effect-transistor 31. A FET 100 of this type is suitable for use as any of FETs T1, T2, T3, T4.

A first drift region 121 extends, in the vertical direction, between the body 122 and the first semiconductor electrode 120. A second drift region 123 extends, in the vertical direction, between the body 122 and the second semiconductor electrode 124.

The first drift region 121 and the second drift region 123 may be implemented in any manner suitable for the specific implementation. The first and second drift region can be of a first conductivity type having a first type of majority charge carriers, while the body is of a second conductivity type having a second type of majority charge carriers opposite to the first type. For example the drift regions may be n-type semiconductors and the body 122 may be a p-type semiconductor. The first semiconductor electrode 120 and the second semiconductor electrode 124 may be implemented in any manner suitable for the specific implementation. The first and second semiconductor electrodes can be of a first conductivity type, having a first type of majority charge carriers but with a higher dopant concentration than the respective first and second drift regions 121, 123.

An electrical path extends vertically between the first semiconductor electrode 120 and the second semiconductor electrode 124. The electrical path can be selectively enabled or disabled to allow current to flow in a first direction, e.g. from the first semiconductor electrode 120 to the second semiconductor electrode 124 or a second direction, opposite to the first direction. The electrical path comprises the first drift region 121, the body 122 and the second drift region 123.

One or more vertical trenches 110 extend vertically adjacent the body and comprise a gate electrode 111 that is separated from the body by a gate dielectric 114. The gate electrode 111 is used to selectively enable or disable the electrical path.

In the shown example a first vertical trench 110 and a second vertical trench 110 extend in the vertical direction from an upper portion adjacent the first semiconductor electrode 124, past and adjacent to the second drift region 123, past and adjacent to the body 122 and past and adjacent to the first drift region 121 and partially into the first semiconductor electrode 120. Hereinafter, the vertical sidewalls of the trench 110 closest to, and facing towards, the body 122 are referred to as the inner sidewalls 115 and the vertical sidewalls facing away from the body 122 are referred to as the outer sidewalls. The body 122, first drift region 121 and the second drift region 123 extend laterally between the first and second vertical trench 110.

In the shown example, each of the first and second vertical trench 110 comprises a gate electrode 111 in a first part of the vertical trench 110. The gate electrode 111 is electrically isolated from the body 122 by a gate dielectric, in this example formed by a gate dielectric layer 114 lining the inner sidewall in the first part of the trench. The gate electrode 111 is coupled, via capacitive coupling, to the body 122 and, when a suitable voltage is applied to the gate electrode a vertical channel is formed in the body 122. Through the vertical channel a current can flow from the first drift region 121 to the second drift region 122, when the first semiconductor electrode 120 is at a positive voltage with respect to the second semiconductor electrode 124, or vice versa when the second semiconductor electrode 124 is at a positive voltage with respect to the first semiconductor electrode 120.

The bi-directional trench field effect power transistor 100 is a layered device comprising a substrate 101, layer stack 102 and a passivation layer 103. The first semiconductor electrode 120, is present at the backside of the substrate 101, and extends over the bottom surface of the substrate 101.

The vertical trench 110 may be implemented in any manner suitable for the specific implementation. The first and second vertical trench 110 are very deep trenches which extend in the shown example from the top of the layer stack 102 into the substrate 101. However the vertical trenches may be less deep, and for example extend until the substrate 101 top surface, i.e. the bottom of the trench touching the substrate top surface 1010. Likewise, the vertical trenches 110 may terminate slightly above the substrate 101, for example at a vertical position closer to the substrate top surface 1010 than to the middle of the first drift layer 121.

The bi-directional trench field effect power transistor 100 may additionally comprise a body electrode connected to the body 122. Alternatively, the body electrode may be absent and the body 122 may be a fully floating body.

Each of the electrodes present in the semiconductor product is connectable to an external power supply, not shown. The connection between the electrodes and the external power supply may be provided in any conventional manner, and is not described in further detail.

Drift Regions

The first drift region 121 extends in lateral direction between the vertical trenches and is defined by the inner sidewalls of the vertical trenches. The first drift region 121 extends in vertical direction from the top-surface of the first semiconductor electrode 120 until the bottom of the body 122. Suitable lower limits for the thickness have been found to 2 micron or more, such as 5 micron or more, for example 10 micron or more, and suitable upper limits 10 micron or less, such as 5 micron or less, such as 2 micron or less. The first drift region 121 may for example be mono-crystalline, and grown on the substrate through for instance an epitaxial process. The first drift region may be of the same material, e.g. Si, as the first semiconductor electrode 120 but with a lower doping concentration. A suitable dopant has been found to be P or As with a resistivity of 0.2 Ohm*cm or more, e.g. 0.5 Ohm*cm or more, such as 0.8 Ohm*cm or more. A suitable upper limit has been found a resistivity of 1 Ohm*cm or less. A particularly effective resistivity has been found to be 0.4 Ohm*cm on average. The resistivity may vary in the first drift region 121, for example as a function of depth, in a manner suitable to increase the breakdown voltage of the power transistor. The first drift region 121 may for example be provided with a linearly graded doping to obtain a suitable resistivity variation.

The second drift region 123 may, as in the examples, have essentially the same characteristics as the first drift region 121. In the example, the thickness of the second drift region 123 is much less than of the first drift region 121. A suitable thickness has found to be 1 micron or more, for example 1.5 micron.

Semiconductor Electrodes

The first semiconductor electrode 120 and second semiconductor electrode 124 may be implemented in any manner suitable for the specific implementation. In the shown examples, the first and second semiconductor electrode 120, 124 are of the same, first, conductivity type as the drift regions 121,123 and opposite to the conductivity type of the body 122. The concentration of majority charge carriers in the first semiconductor electrode 120 is higher than in the first drift region 121. The concentration of majority charge carriers in the second semiconductor electrode 124 is higher than in the second drift region 123. The semiconductor electrodes 120, 124 may for example be doped or otherwise be provided with a resistivity which is at least one order of magnitude smaller than the resistivity of the drift regions 121, 123.

The first semiconductor electrode 120 is formed by the substrate 101. On the bottom of the substrate 101, also referred to as the back-side, a metal layer 129 is provided which constitutes the electrode for the first semiconductor electrode 120 and allows to connect the first semiconductor electrode 120 to an external voltage or current supply. In this example, the substrate 101 is of a semiconductor material provided with a dopant of the same type as the first drift region 121 (e.g. an n-type doping or a p-type doping) to make the first semiconductor electrode 120 highly conductive compared to the first drift region 121. For instance, the doping concentration may be at least 2.5 orders of magnitude higher than in the drift region 121, 3 orders or more have been found to be particularly effective. The substrate 101 may be any suitable type of substrate such as a mono-crystalline Si substrate with a <100> orientation, and doped with a suitable dopant, such as in case of an N-doped semiconductor electrode Arsenic (As), to obtain a resistivity of less than 1 mOhm*cm, such as less than 0.005 Ohm*cm, for example 0.03 Ohm*cm or less.

The second semiconductor electrode 124 may be implemented in any manner suitable for the specific implementation, and be of similar constitution as the first semiconductor electrode 120, but in terms of conductivity and doping concentration different, for example with a doping concentration which is an order of magnitude higher.

Body

The body 122 may be implemented in any manner suitable for the specific implementation. In the shown example, the body is defined in lateral direction by the inner sidewalls of the vertical trenches 110 and in vertical direction between by the bottom of the second drift region 123, and the top of the first drift region 121. The body 122 may for example be formed by doping a semiconductor material, e.g. Si, with a suitable dopant. A suitable dopant has been found Boron, such as B11. A suitable concentration has been found to be 2 orders of magnitude smaller than that of the first semiconductor electrode 120.

Layer Stack

The layer stack may be implemented in any manner suitable for the specific implementation. In the shown example, the layers stack 102 comprises a bulk layer of a base material of the first conductivity type with a concentration of majority charge carriers equal to a concentration in the first drift region 121 or in the second drift region 123. The bulk layer is provided with one or more doped layers in which a doping is different than in the base material. The doped layer having a second conductivity type and/or a concentration of majority charge carriers higher than the base material. Thus, in the example shown, the layers of the layer stack 102 are formed from the same base material. However, alternatively the layer stack may comprise a plurality of different layers of different base materials, for example individually grown on top of each other during consecutive phases of manufacturing of the power transistor.

The doped layers in the bulk layer may for example comprise one or more of the group consisting of: a buried layer of the second conductivity type, in which the body 122 is present; a source layer of the first conductivity type with a concentration of majority charge carriers higher than the base material, in which the second semiconductor electrode 124 is present, the source layer is separated from the buried layer 122 by a drift layer of the base material which the second drift region 123 is present; a drain layer of the first conductivity type with a concentration of majority charge carriers higher than the base material, in which the first semiconductor electrode 120 is present, the drain layer is separated from the buried layer by a drift layer of the base material in which the first drift region 121 is present.

Isolation

The arrangement may, as in the example, be provided with an enclosure which isolates or protects the arrangement. For instance, the arrangement shown is enclosed by, a well 108 of a conductivity type opposite to that of the first semiconductor electrode 120, which in turn is enclosed by a shallow trench isolation, STI, 109 at the top of the layer stack 102. The well 108 extends in lateral direction partly under the STI 109 and is in direct contact with the STI. The well 108 extends in vertical direction from the top of the layer stack 102 towards the substrate 101 in the layer 102. In this example the layer 102 has the same concentration of majority charge carriers as the first drift region 121 and is a doped semiconductor layer with the same doping concentration as the first drift region 121.

Characteristics

The bi-directional trench field effect power transistor 100 shown can support high energies, i.e. high currents and/or voltages. The power transistor 100 may for example have a current maximum of more than 1 A, such as 10 A or more, such as 100 A or more, such as at least 200 A and/or a positive drain-source break down voltage of at least 25 V, for example 50 V or more, and a negative drain-source break down voltage of at least 25 V, for example 30 V or more, such as 50 V or more, for example 100 V or more, e.g. 300 V or more. The bi-directional trench field effect power transistor 100 may be symmetric with positive and negative break down voltages that have the same absolute value, or be asymmetric, with different values, depending on the specific implementation. For an asymmetric transistor, a suitable positive breakdown voltage has found to be between 1.5 and 2 times that of the negative breakdown voltage, such as 45 V for a 25 V negative breakdown voltage. For instance, depending on the specific implementation the thickness of the first and/or second drift region may be adapted to obtain a breakdown voltage for the specific implementation.

Shield Plate

In the example shown, but not necessarily all examples, each of the first and second vertical trench 110 comprises a lower shield plate 112. The lower shield plate 112 is in this example additional to the lateral isolation of the first drift region 121 by the vertical trench 110. However, it should be apparent that the lower shield plate 112 may be used without the lateral isolation of the first drift region 121, and that the lateral isolation of the first drift region may be used without a shield plate 112. The shield plate 112 is situated in a lower part of the trench 110. This lower part is closer to the substrate 101 than the part occupied by the gate electrode 111.

The shield plate 112 is capable of generating a vertical accumulation layer in the first drift region 121, e.g. along the inner sidewall of the trench, when the lower shield plate 112 is biased with respect to the first semiconductor electrode 120 in a first polarity. For example, in case the first semiconductor electrode 120 is an n-doped semiconductor material, the accumulation layer can be generated when the lower shield plate 112 is sufficiently positively biased. In case the first semiconductor electrode 120 is a p-doped semiconductor material, the accumulation layer can be generated when the lower shield plate 112 is sufficiently negatively biased. In the shown examples the accumulation layer will extend in a vertical direction through the whole first drift region 121, from the bottom limit of the body 122 to the first semiconductor electrode 120. Thus, a conductive path between the body 122 and the first semiconductor electrode 120 may be established in a relatively fast manner. However, depending on the specific implementation, the accumulation layer may extend in a vertical direction through a part of the first drift region 121 only, and e.g. be spaced from the body or the first semiconductor electrode 120.

The shield plate 112 can further locally reduce the electrical field density in parts of the first drift region 121 when the lower shield plate 112 is biased with respect to the first semiconductor electrode 120 in a second polarity. For example, in case the first semiconductor electrode is an n-doped semiconductor material, the reduction is obtained when the lower shield plate 112 is sufficiently negatively biased. For example, in case the first semiconductor electrode 120 is an n-doped semiconductor material, the reduction is obtained when the lower shield plate 112 is sufficiently negatively biased. Thus, unexpected breakdown may be reduced because overly high electric fields in the first drift region 121 may be avoided while the speed of switching may be improved since the current path through the drift region 121 can be enabled more rapidly by creating the accumulation layer.

Upper Shield Plate

In some but not necessarily all examples, the vertical trenches 110 may be provided, in addition to the gate electrode 11 and the lower shield plate 112, with other elements of the power transistor 100. For instance, each vertical trench 110 may further comprise an upper shield plate 125. The upper shield plate 125 may be controlled in a similar manner as the lower shield plate 112 and be arranged to generate an accumulation layer in the second drift region 123 when the upper shield plate 125 is biased with respect to the second semiconductor electrode 124 in the first polarity and reducing, at least locally, the electrical field density when the upper shield plate 125 is biased with respect to the second semiconductor electrode 124 in the second polarity. There, unexpected breakdown may be reduced because overly high electric fields in the second drift region 123 may be avoided while the speed of switching may be improved since the current path through the second drift region 123 can be enabled more rapidly by creating the accumulation layer. As shown, the upper shield plate 125 may have a similar shape as the lower shield plate 112 and be separated from the second drift region 123 by a suitable dielectric.

Trench Enclosure

In this example, the terms first vertical trench and second vertical trench are used for convenience to denote the trench part at opposite sides of the electrical path, however, they may both be parts a single elongated vertical trench enclosure which, in a plane parallel to the substrate top-surface, encloses the electrical path.

The elongated vertical trench enclosure comprises an elongated enclosing gate electrode which comprises the gate electrodes 114 of the vertical trenches 110 and an elongated enclosing lower shield plate which comprises the lower shield plates 112 of the vertical trenches, the enclosing gate electrode enclosing the body 122 and the enclosing lower shield plate enclosing the first drift region 121. It will be apparent that the enclosing shield plate may be absent when the transistor is implemented without shield plate(s).

Trenches-Dielectric

Also, the vertical trenches 110 may be filled, e.g. with the electrodes 111,112 and dielectrics 113,114 in any suitable manner. In the shown example, for instance the vertical trenches extend into the substrate 101 and the shield plate 112 terminates above the substrate 101. The shield plate 112 is isolated from the substrate 101 by a thick dielectric at the bottom of the trench 110. Thereby, the substrate 101 operation can be effectively decoupled from the voltage of the shield plate 112.

Furthermore, at least the inner sidewall 115 of the vertical trenches 110, and in this example both the inner and outer sidewall, may be covered with a dielectric which separates respectively the gate electrode 111 and the shield plate 112 from the sidewall. Hereinafter the dielectric in the first part is referred to as the gate dielectric 114 and the dielectric in the lower part is referred to as the shield dielectric 113. As shown, the dielectric is along the surface of the sidewall in contact with respectively the body 122 and the drift regions 121,123. The dielectric is thinner in the first part than in the lower part. Thus, the gate electrode 111 is sufficiently coupled in order to generate the channel whereas the shield plate 112 is less coupled to the drift region 121, to enable creating the accumulation layer and the reduction of the electrical field density. In the shown example the gate dielectrics 114 and the shield dielectrics 113 are of the same material, e.g. silicon oxide. However, depending on the specific implementation, the dielectrics may be of different materials. Although the dielectrics 113,114 are shown as a single vertical dielectric layer, it will be apparent that the dielectric may comprise a stack of two or more vertical layers. Furthermore, the gate electrode 111, and if present shield plate(s) 112, filling parts of the vertical trench 110 may be implemented in any manner suitable for the specific implementation and have any suitable shape, size and configuration. The dielectric thickness may be varied throughout the trench 110.

Operation

The power transistor 100 may be used to control the flow of current. The shown example of power transistor 100 may for example be used in a method for operating a power transistor as described below, although it will be apparent that other types of bi-directional power transistors may be used as well to perform such a method. The power transistor can be operated intermittently in a first direction or a second direction, i.e. bi-directional. The bi-directional nature of the power transistor 100 will now be described in operation, using the example of a n-type power transistor.

In a first direction and in respect of switching the power transistor 100 on, a positive voltage may be applied to the first semiconductor electrode 120 (drain). The body 122 may be connected to the second semiconductor electrode 124 (source), so as to electrically couple the body 122 to the source. To the shield plate 112 a positive bias voltage sufficient to generate an accumulation layer in the first drift region may then be provided. A positive gate bias voltage, $V_{gs}>0V$, may be applied on the gate electrode 111 causing a depletion field effect through the gate dielectric 114 into a region of the body 122 that contacts the first and second trenches 110. When the gate bias voltage exceeds a threshold voltage Vth, an inversion conducting n-layer may be formed along the interface of the trench 110 and the body 122, which conducts the majority of n-type carriers injected from the source 124 to be collected by the drain 120.

In an off-state, a positive voltage may be applied to the drain 120. The body 122 may still be electrically tied to the source 124 and so be subjected to a source potential. The gate bias voltage may be set to a lowest potential, namely $V_{gs}=0V$. A first depletion layer may be formed around a bottom p-n junction formed by the interface of the body 122 and the first drift region 121. By increasing the drain-source bias voltage, Vds, a first space charge region of the depletion layer may increase to the low-doped bottom part of the first drift region 121. The electrical field in the region thereby increases and when a breakdown voltage is reached, an avalanche phenomena by carrier impact ionization may be observed causing breakdown of the reverse biased junction mentioned above. A negative bias voltage may be provided to the shield plate. This reduces the electrical field density in at least a part of the first drift region 121, and accordingly the breakdown voltage can be increased.

In the second direction and in relation to an on-state, the drain 120 is coupled to the body 122. A positive voltage may be applied to the source 124. The positive gate bias voltage, $V_{gs}>0V$, may be applied to the gate 111, thereby causing a depletion field effect through the gate dielectric 114 into the body 122 along the inner sidewalls of the trenches 110. When the gate bias voltage exceeds the threshold voltage Vth an inversion conducting layer may be formed along the interface of the trench dielectric and the body 122, which may conduct the majority of the carriers injected from the drain 120 and collected by the source 124.

In an off state, a positive voltage may be applied to the source 124. The body 122 may still be electrically tied to the potential of the drain 120. The gate bias voltage, Vgs, may be set to the lowest potential, namely, Vgs=0V. A second depletion layer may be formed around a top p-n junction formed by the interface of the body 122 and the second drift region 123. By increasing the drain-source bias voltage, Vds, a second space charge region of the depletion layer may increase to the low-doped top part of second drift region 123. The electrical field in the region may thereby increase and when a breakdown voltage is reached, an avalanche phenomena by carrier impact ionization may be observed causing breakdown of the reverse biased junction mentioned above, thereby implementing the blocking voltage.

Manufacture

The power transistor 100 may be manufactured in any manner suitable for the specific implementation.

Figure 8:
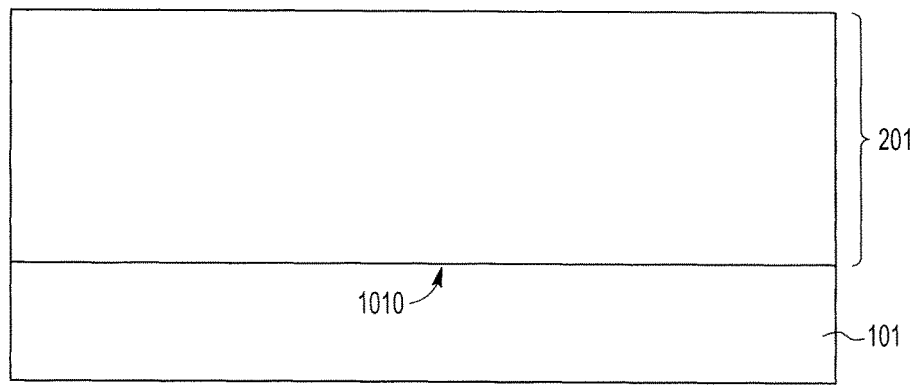
FIGS. 8 to 24 are sectional views of a vertical insulated-gate field-effect-transistor in successive stages of a method of manufacturing thereof.

Referring to FIG. 8, the power transistor 100 may comprise a substrate 101. In case of an n-type power transistor 100, the substrate 101 may be strongly doped with an N-type dopant, such as Arsenic to form the first semiconductor electrode 120. A suitable substrate material is found to be mono-crystalline Silicon with a <100> orientation for example. However other substrate types may be used as well.

On the top surface 1010 of the substrate 101, a layer stack may be manufactured in any suitable manner. For example, a bulk layer 201 may be provided, e.g. by epitaxial growth, extending over the top-surface 1010 and directly adjacent thereto. The bulk layer 201 may be monolithic, and for example of the same material as the substrate, i.e. <100> Si.

However the bulk layer or substrate may alternatively be of a different material, such as SiC or GaN. The substrate may be a single material, e.g. Si, or be an engineered substrate consisting of multiple, initially unpatterned layers layered one on top of the other.

In the shown example the bulk layer 201 has about the thickness of the layer stack 102, e.g. 5 micron, and subsequently several layers are created by modifying the characteristics of the bulk layer at different depth, e.g. through suitable doping implant and activation. However, alternatively the bulk layer may be thinner than the layer stack and serve as a bottom layer thereof, with the additional layers of the layer stack being created by growth on the bulk layer, e.g. of an oppositely doped epitaxial layer for the body 122, and on top of the oppositely doped epitaxial layer another epitaxial layer for the second drift region 123.

Figure 9:
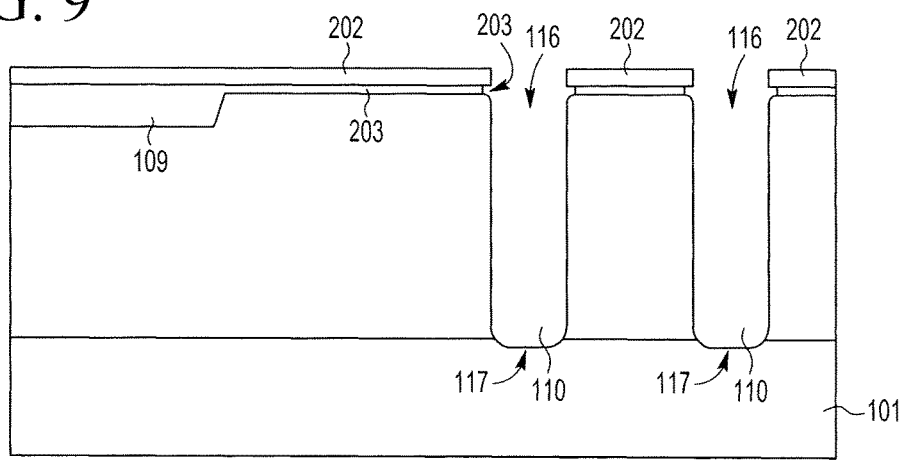

Referring to FIG. 9, the bulk layer may be provided on the, exposed top-surface with a pad layer, in this example a thin layer of a pad oxide 203 and a thicker layer of pad nitride 202 on top of the pad oxide layer 203, and locally be provided with the STI 109. Vertical trenches 110 may be etched in the bulk layer 201. For example, over the pad layers a hard mask may be deposited, e.g. a tetraethyl orthosilicate (TEOS) hard mask, after which the hard mask and pad-layers are locally etched to expose the top surface of the bulk layer 201 in the areas where the trenches are to be provided. The bulk layer 201 may then be etched to the desired depth of the trenches 110. In this example the bulk layer 201 is etched until the substrate layer 101 and the substrate itself is slightly etched. For example, etching may remove in vertical direction from the top-surface of the bulk layer, between 0.1 and 0.5 micron more than the thickness of the bulk layer i.e. into the substrate 101. As illustrated in FIG. 9, the resulting trenches extend from a trench top 116 into the bulk layer, and in this example beyond the bulk layer into the substrate 101, to a trench bottom 117. The trench bottom 117 may be rounded, for example by first etching the trench and a subsequent rounding. The subsequent rounding may for example be obtained by depositing on the walls of the trench a sacrificial layer, e.g. Silicon-oxide, of a suitable thickness, e.g. several hundred, such as 800, Angstom, and subsequently over etching the sacrificial layer, e.g. several hundred Angstrom more than the thickness of the sacrificial layer.

Figure 10:
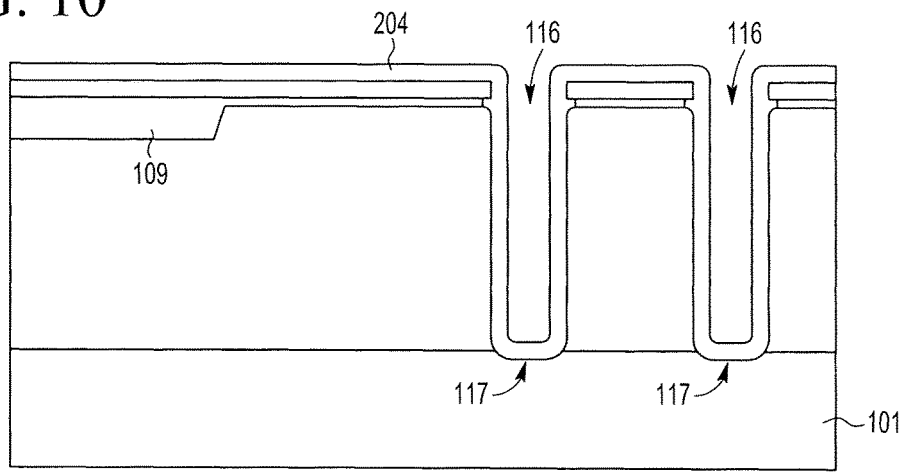

Referring to FIG. 10, after the shape of the trenches has been defined by the etching, the walls of the trenches may be provided with a lining dielectric, e.g. silicon oxide, of a suitable thickness, e.g. several hundred, such as 700, Angstrom. In the shown example, the dielectric is a continuous lining layer 204 formed by depositing a lateral dielectric layer, e.g. silicon-oxide, which fills the bottom of the trench, over the exposed lateral surfaces of the intermediate product, and oxidizing the vertical sidewall to obtain a dielectric layer of 700 Angstrom.

Figure 11:
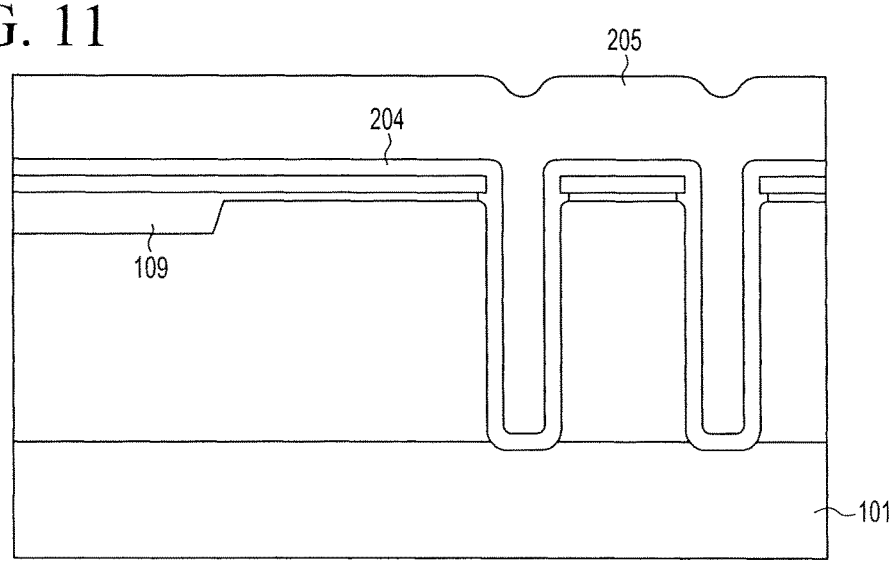
Figure 12:
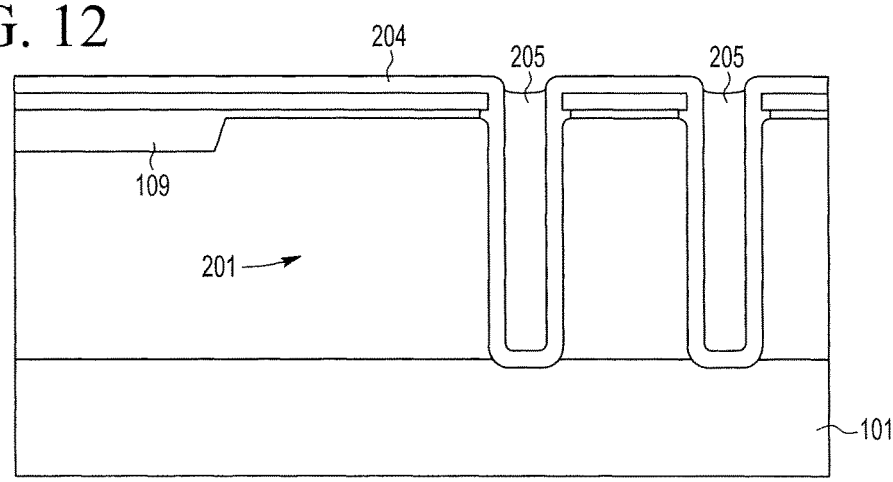
Figure 13:
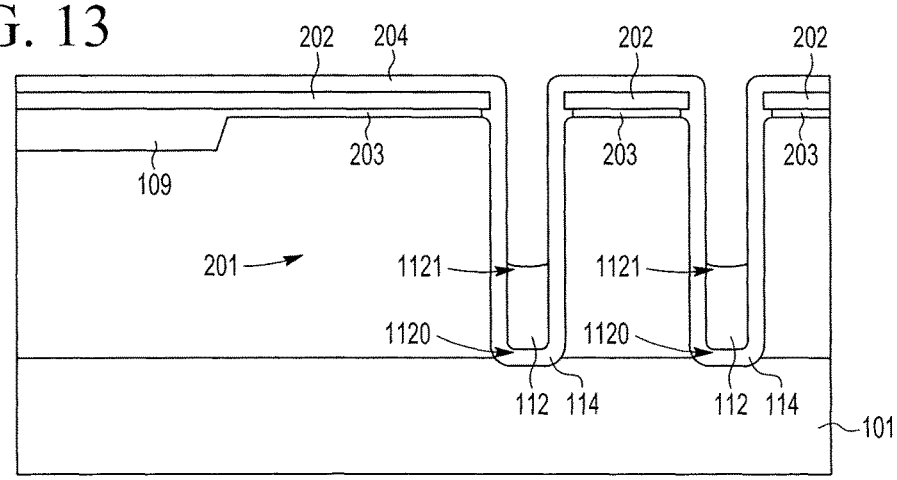
Figure 14:
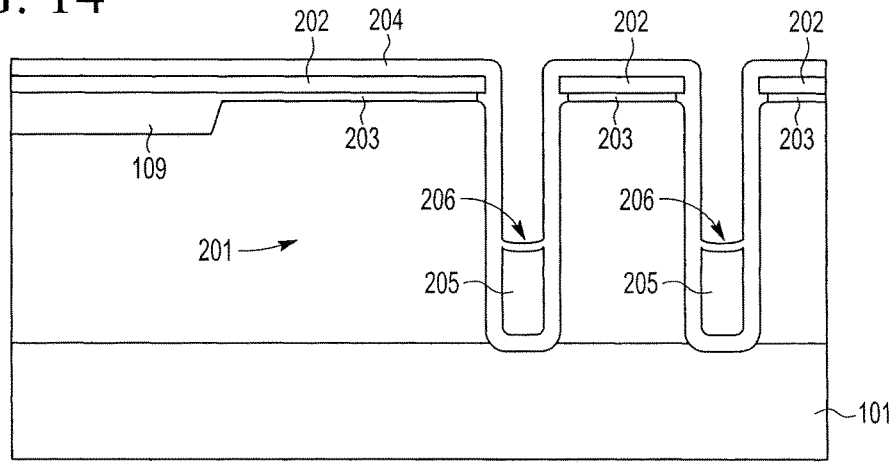

Referring to FIGS. 11-13, after the lining is formed the shield plate 112 (if present) may be formed. The shield plate 112 may for example be formed by filling the trenches with a suitable electrode material, such as doped polysilicon or a metal. A suitable electrode material has found to be polysilicon doped with phosphor at a concentration of $1 \cdot 10^{20}$ atoms per cubic centimeter (at/cm3). In the shown example, a thick blanket layer 205 of polysilicon with a suitable dopant, is deposited, for example using Low-Pressure Chemical Vapor Deposition, over the exposed surfaces. The blanket layer is sufficiently thick to completely fill the trenches, as shown in FIG. 11.

Referring to FIG. 12, the blanket layer 205 is then reduced in thickness until the directly underlying lateral surface 204 is exposed. For example the blanket layer 205 may be planarized, e.g. by chemical-mechanical planarization (CMP) down to a hard mask, e.g. a TEOS hard mask, on which the blanket layer is deposited.

Referring to FIG. 13, the final shield plate 112 may then be obtained by further removing, e.g. through etching, the remaining parts of the layer 205 until the desired height of the shield plate 112. As shown in FIG. 13 the resulting plate structure 112 extends between a plate top 1121 and a plate bottom 1120. The plate bottom 1120 is slightly above the substrate 101 and separated from the substrate by the dielectric in the bottom 117 of the trench 110.

Referring to FIGS. 14-17, in case the power transistor 100 is to be provided with a shield plate 112 an intermediate dielectric layer 206 may be provided in the trench 110 on the plate top 1121, which serves to separate the shield plate 112 from the gate electrode 111. The formation of the intermediate dielectric may for example comprise re-oxidizing the plate top 1121 after additional etching of the plate top 1121 to obtain a rounded, e.g. convex or concave, plate top 1121, with a re-oxidized top surface 206 as show in FIG. 14.

Figure 15:
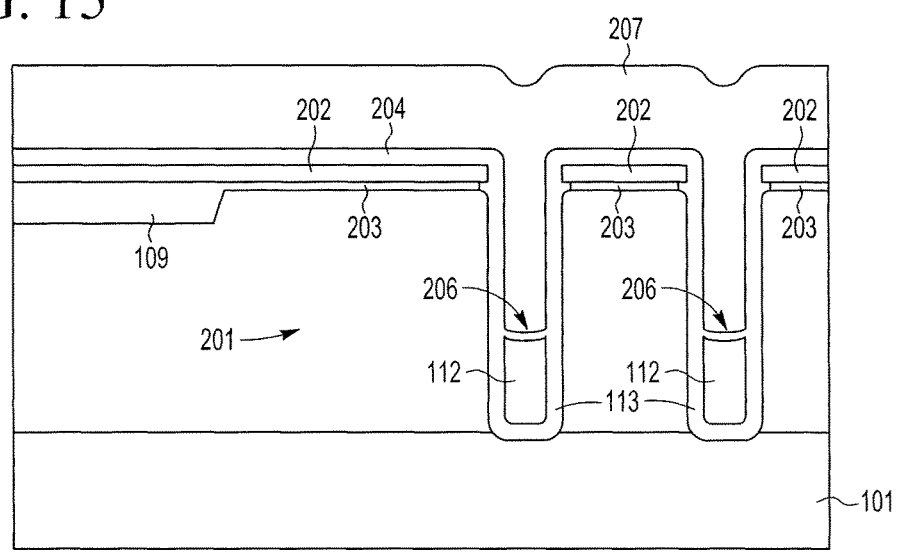
Figure 16:
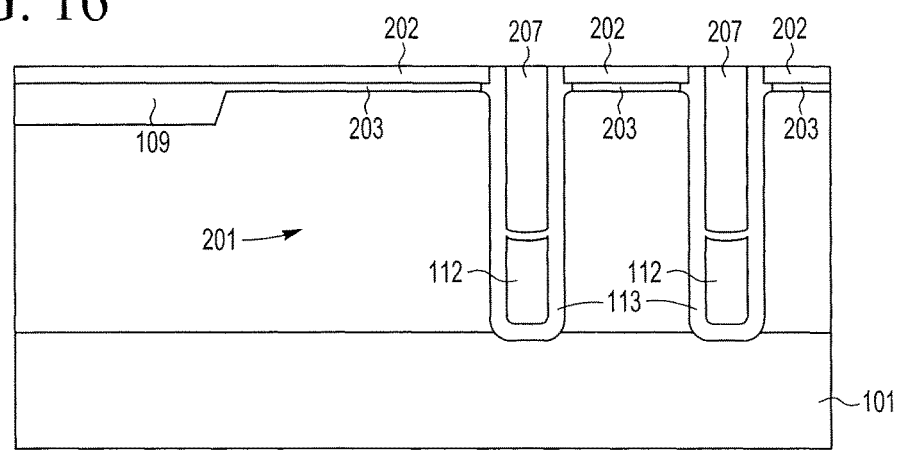
Figure 17:
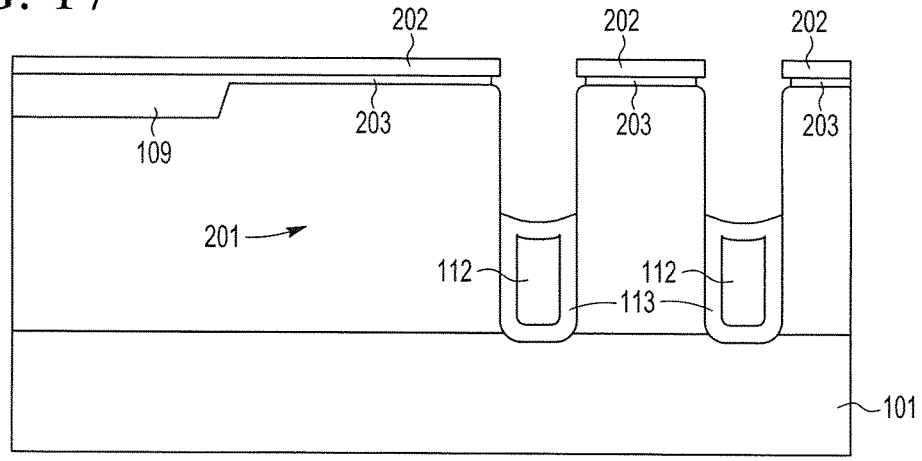

After that, a blanket dielectric layer 207 may be deposited which covers the exposed lateral surface of the layer stack and fills the trenches up to the re-oxidized top surface 206, see FIG. 15. The blanket dielectric layer 207 may subsequently be removed outside the trenches, as shown in FIG. 16 and reduced in thickness in the trenches 110 to obtain the desired intermediate dielectric thickness.

A suitable material for the intermediate dielectric has been found to be TEOS. For instance, a TEOS layer may be deposited as blanket dielectric layer 207, e.g. in this example on the pad nitride layer 202. The TEOS layer may then be planarized, e.g. through CMP or otherwise, down to the pad nitride layer 202. The TEOS layer may then be etched in the trenches 110 until the desired depth.

Figure 18:
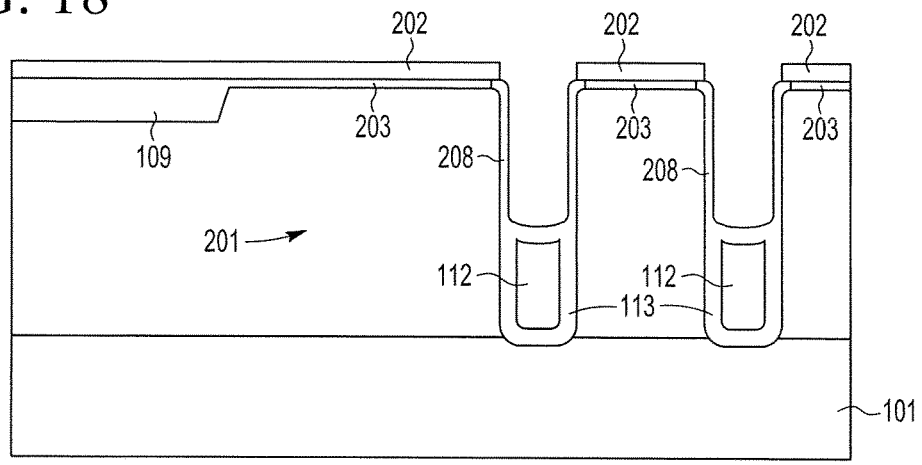

Referring to FIGS. 18-21, after the intermediate dielectric is formed if the trench 110 is to be provided with a shield plate 112, the gate electrode 111 may be formed. In this example, a thin gate dielectric layer 208 is then formed on the vertical sidewalls of the trenches in the not filled parts thereof, i.e. between the intermediate dielectric and the top of the trench 110, as shown in FIG. 18. For example a silicon oxide layer of several hundred Angstrom, e.g. a thermal silicon oxide of 700 Angstrom, may be provided to form the vertical gate dielectric 114. After that the actual gate electrode 111 may be formed.

Figure 19:
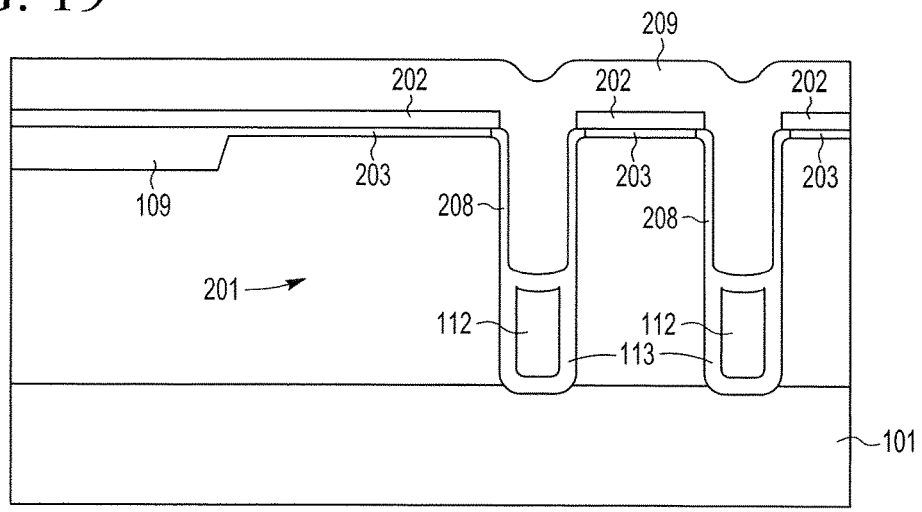

Referring to FIG. 19, the gate electrode 111 may for example be formed by filling the trenches 110 with a suitable electrode material, such as doped polysilicon or a metal. A suitable electrode material has found to be polysilicon doped with phosphor at a concentration of $1 \cdot 10^{20}$ at/cm3. In the shown example, a thick blanket layer 209 of polysilicon with a suitable dopant is deposited, for example using Low-Pressure Chemical Vapor Deposition, over the exposed surfaces. The blanket layer 209 is sufficiently thick to completely fill the trenches 110 from the intermediate dielectric, as shown in FIG. 19. The blanket layer 209 is then reduced in thickness until the directly underlying lateral surface is exposed. For example the blanket layer 209 may be planarized, e.g. by chemical-mechanical planarization (CMP) down to the top-surface of the top nitride layer 202, on which the blanket layer 209 is deposited.

Figure 20:
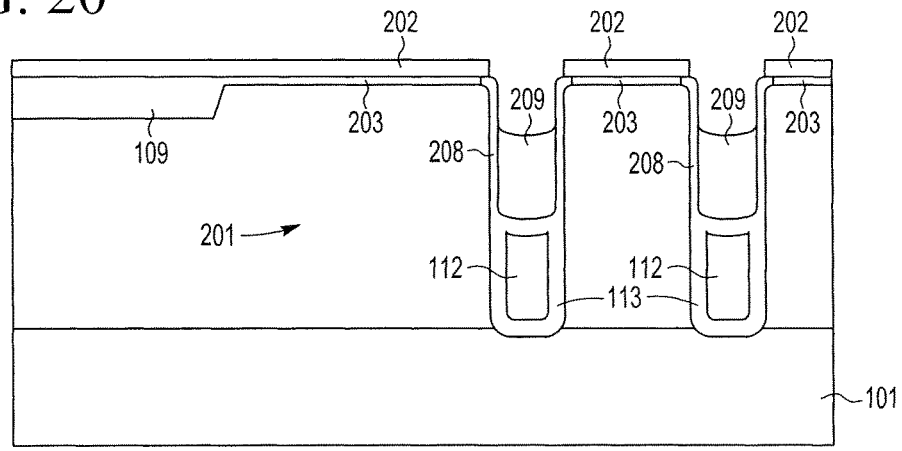

Referring to FIG. 20, the final shield plate may then be obtained by further removing, e.g. through etching, the remaining parts of the layer 209 until the desired height of the gate electrode 111. In this example, the gate electrode extends from the intermediate dielectric until 1 micron or less, e.g. 0.9 micron, below the top surface of the bulk layer 201.

Figure 21:
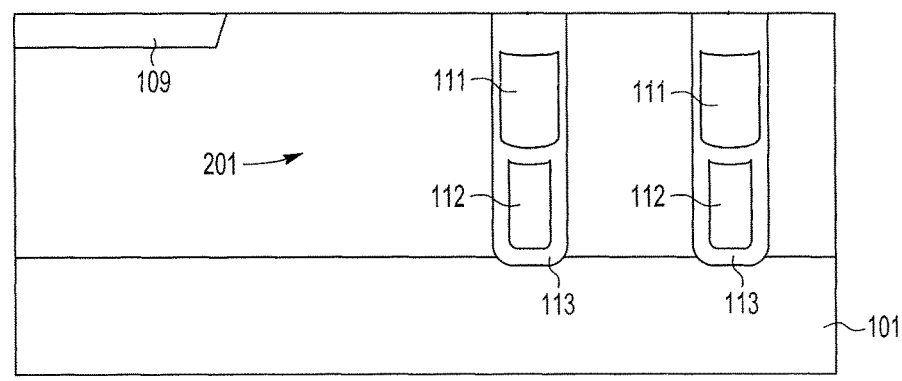

Referring to FIG. 21, the exposed top of the gate electrode may then be covered with a top dielectric, for example by filling the rest of the trench 110 with a suitable dielectric. For instance, a thin layer, e.g. 400 Angstrom, may be grown on the exposed top, for example of thermal silicon oxide, which is subsequently covered with another dielectric. The other dielectric may for example be deposited as a blanked layer covering the exposed lateral surfaces of the intermediate product, which subsequently is reduced in thickness down to the top-surface of the bulk layer 201 hence removing the top nitride and top oxide layers 202, 203, e.g. a TEOS layer which subsequently is planarized, e.g. by CMP.

Figure 22:
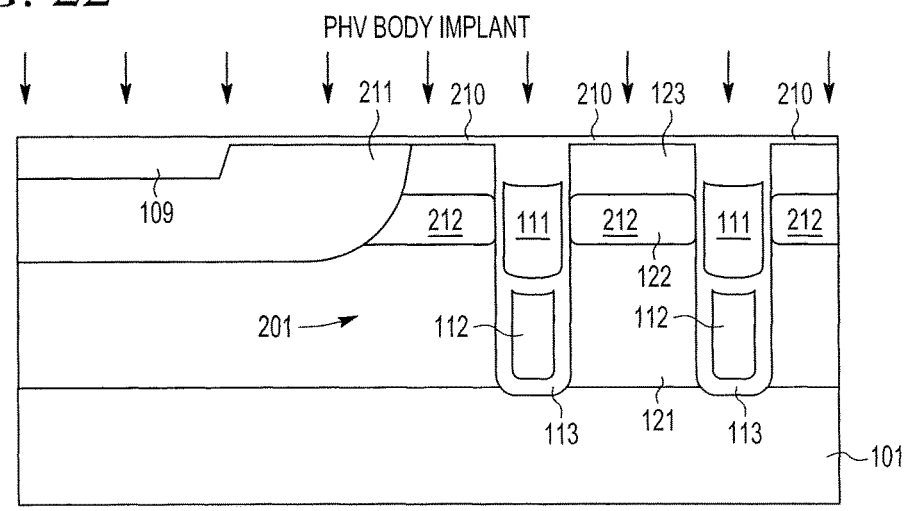

Referring to FIG. 22, after forming the gate electrode 111 and hence finalizing the vertical trenches 110, the body 122 may be formed. It will be apparent though that in an alternative embodiment the body 122 and/or drift regions 121, 123 and/or semiconductor electrodes 124 may be formed before forming the trenches 110 or before filling the trenches 110.

In this example, the body 122 is formed by implanting a dopant layer 212 at a convenient depth and subsequent activation of the dopant. For example, in case of a n-type transistor, implantation and activation of a p-type dopant, e.g. Boron, such as B11, may be performed. For instance, a dose of $2 \cdot 10^{13}$ at/cm3 implanted with 700 kEV energies may be provided and activated by a furnace anneal.

As shown in FIG. 22, locally a well 211 of same conductivity type as the body may be formed, e.g. by local implant of a dopant. For instance in case of a n-type transistor, implantation and activation of a p-type dopant, e.g. Boron, such as B11, may be performed. For instance, successive doses of $2 \cdot 10^{13}$ atoms per square cm (at/cm2), $1 \cdot 10^{13}$ at/cm2, $1 \cdot 10^{13}$ at/cm2, $6 \cdot 10^{12}$ at/cm2 may be implanted with respectively 30 keV, 140 keV, 250 keV, 1 MeV energies and activated by a furnace anneal. The concentration in at/cm2 being measured parallel to the top-surface. Prior to the doping implant, a sacrificial layer 210 of e.g. 400 Angstrom silicon oxide may be deposited on top of the bulk layer to protect the bulk layer during doping implantation, e.g. from low energy debris that comes along with the implant.

Figure 23:
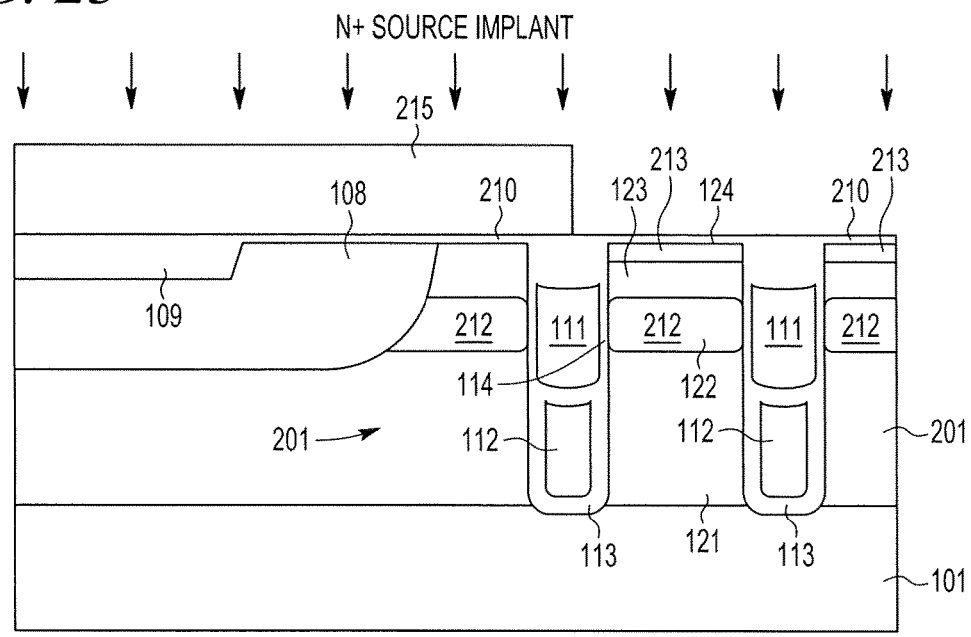

Referring to FIG. 23, the second semiconductor electrode 124 may be formed by implanting a dopant layer 213 at a convenient depth and subsequent activation. For example, in case of a n-type transistor, implantation and activation of an n-type dopant, e.g. As, may be performed. For instance, an dose of $7 \cdot 10^{15}$ at/cm2, with 80 kEV implant energy may be provided under an angle of 0.5 degrees from the vertical and activated by a furnace anneal. As shown in FIG. 23, to protect the areas where the layer 213 should not be present, a blocking layer 215, for example of Co4N, may be provided on the exposed top surface of the layer stack.

Figure 24:
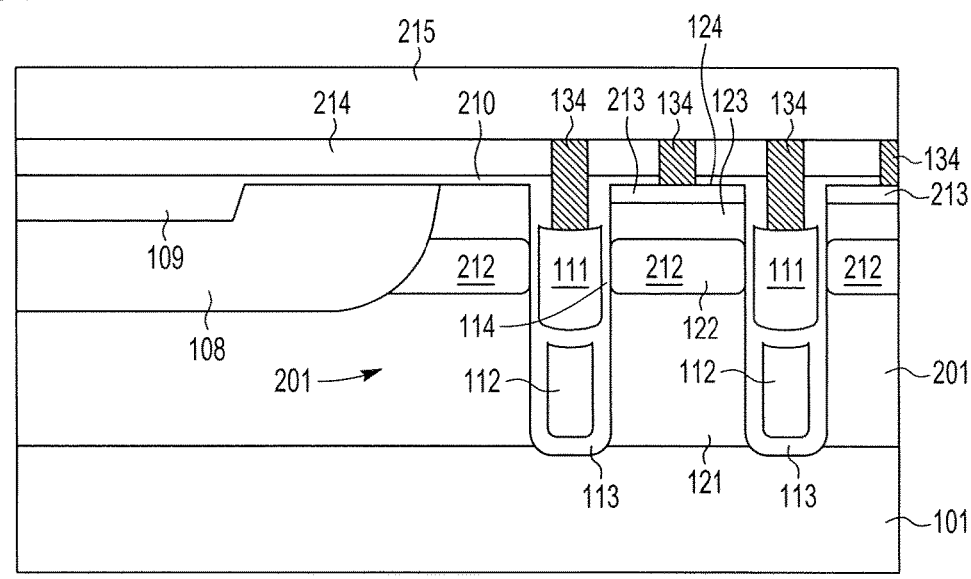

Referring to FIG. 24, after forming trenches 110, the body 122, the drift regions 121, 123 and semiconductor electrodes 124, 120, suitable contacts may be provided and the power transistor 100 be finalized. E.g. an interlayer dielectric layer 214 may be provided, such as a TEOS layer, in which openings are provided where vias are formed that connect to the gate electrode 111, body 122, semiconductor electrodes 124, 120 etc. and one of more interconnect layers provided on the interlayer dielectric layer 214 that are connected to respective parts of the power transistor through suitable vias 134. It will be apparent that after finalizing the power transistor 100, on the same die other structures may be provided and that the die may be packaged in a package suitable to support the currents and voltages the power transistor is designed for.

In the foregoing description, the invention has been described with reference to specific examples of embodiments of the invention. It will, however, be evident that various modifications and changes may be made therein without departing from the scope of the invention as set forth in the appended claims, and that the claims are not limited to the specific examples given in the foregoing description. Of course, the above advantages are examples, and these or other advantages may be achieved by the examples set forth herein. Further, the skilled person will appreciate that not all advantages stated above are necessarily achieved by embodiments described herein.

For example, the semiconductor substrate described herein can be any suitable semiconductor material or combinations of materials, such as gallium arsenide, silicon germanium, silicon-on-insulator (SOI), silicon, monocrystalline silicon, the like, and combinations of the above.

Likewise, the semiconductor substrate described herein is a mono-layer but the semiconductor substrate may also be an, unpatterned, engineered substrate consisting of several layers of different materials.

Also, some of the figures are discussed in the context of a device with a n-type transistor. However, embodiments according to the present invention are not so limited. That is, the features described herein can be utilized in a p-type transistor. The discussion of an n-channel device can be readily mapped to a p-channel device by substituting p-type dopant and materials for corresponding n-type dopant and materials, and vice versa. Likewise, although specific dopants (As, B, P) have been mentioned, it should be apparent that other dopants may be suitable as well.

Furthermore, although in the examples shown, the layer stack is formed from Si, other materials may be suitable as well.

Moreover, the terms "front," "back," "top," "bottom," "over," "under" and the like in the description and in the claims, if any, are used for descriptive purposes and not necessarily for describing absolute positions. It is understood that the terms so used are interchangeable under appropriate circumstances such that the embodiments of the invention described herein are, for example, capable of operation in other orientations than those illustrated or otherwise described herein. Other modifications, variations and alternatives to the examples set forth herein are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor product, comprising:
    a first semiconductor electrode, a second semiconductor electrode and an interconnecting semiconductor electrode defining a third semiconductor electrode;
    a first switch, between the first semiconductor electrode and the third semiconductor electrode, provided by a first vertical insulated-gate field-effect-transistor; and
    a second switch, between the second semiconductor electrode and the third semiconductor electrode, provided by a second vertical insulated-gate field-effect-transistor, wherein
    the interconnecting semiconductor electrode interconnects the first vertical insulated gate field-effect-transistor and the second vertical insulated gate field-effect-transistor,
    wherein at least one of the first vertical insulated gate field-effect-transistor and the second vertical insulated gate field-effect-transistor comprises:
        a lower drift region between a lower planar substrate doped to form a lower current electrode and a body doped to form a vertically extending channel,
        a vertically extending lower shield plate electrode laterally adjacent the lower drift region,
        an upper drift region between an upper portion doped to form an upper current electrode and the body doped to form a vertically extending channel,
        a vertically extending upper shield plate electrode laterally adjacent the upper drift region, and
        a vertically extending insulated gate disposed within a trench in between the vertically extending lower shield plate electrode and the vertically extending upper shield plate electrode, wherein a top surface of the vertically extending insulated gate is separated from and below a bottom surface of the vertically extending upper shield plate electrode.

2. The semiconductor product as claimed in claim 1, wherein the first vertical insulated gate field-effect-transistor and the second vertical insulated gate field-effect-transistor comprise channels of the same semiconductor type.

3. The semiconductor product as claimed in claim 1, wherein the interconnecting electrode is a doped semiconductor electrode, the first semiconductor electrode and second semiconductor electrode are distinct, doped portions of semiconductor material and appropriately doped portions of semiconductor material separate vertically the first semiconductor electrode and the interconnecting semiconductor electrode and appropriately doped portions of semiconductor material separate vertically the second semiconductor electrode and the interconnecting semiconductor electrode.

4. The semiconductor product as claimed in claim 1, wherein the semiconductor product has a first side and a second opposing side, and wherein the third semiconductor electrode is accessible via the first side and the first and second semiconductor electrodes are accessible via the second side.

5. The semiconductor product as claimed in claim 1, wherein the interconnecting semiconductor electrode is a common current electrode for the first vertical insulated-gate field-effect-transistor and the second vertical insulated-gate field-effect-transistor.

6. The semiconductor product as claimed in claim 1, wherein the lower drift region is doped to have the same conductivity type as the lower current electrode and a different conductivity type to the body and wherein the lower drift region has a lower dopant concentration than the body and a lower dopant concentration than the lower current electrode.

7. The semiconductor product as claimed in claim 6, wherein the upper drift region is doped to have the same conductivity type as the upper current electrode and a different conductivity type to the body and wherein the upper drift region has a lower dopant concentration than the body and a lower dopant concentration than the upper current electrode.

8. The semiconductor product as claimed in claim 1, wherein at least one of the first vertical insulated-gate field-effect-transistor and the second vertical insulated-gate field-effect-transistor is a bidirectional power metal-oxide-semiconductor field-effect-transistor.

9. The semiconductor product as claimed in claim 1, wherein the first vertical insulated gate field-effect-transistor provides first and second electrically controllable diodes.

10. The semiconductor product as claimed in claim 1, wherein a current path between the first semiconductor electrode and the second semiconductor electrode consists of only the first vertical insulated-gate field-effect-transistor and the second vertical insulated-gate field-effect-transistor which share the third semiconductor electrode as a common current electrode and wherein the current path comprises no other diode-effect device.

11. The semiconductor product as claimed in claim 1, comprising:
    a second interconnecting semiconductor electrode defining a fourth semiconductor electrode;

a third switch, between the first semiconductor electrode and the fourth semiconductor electrode, provided by a third vertical insulated-gate field-effect-transistor; and a fourth switch, between the second semiconductor electrode and the fourth semiconductor electrode, provided by a fourth vertical insulated-gate field-effect-transistor, wherein the second interconnecting electrode interconnects the third vertical insulated gate field-effect-transistor and the fourth vertical insulated gate field-effect-transistor, and wherein the first and second semiconductor electrodes form a first pair of semiconductor electrodes and wherein the third and fourth semiconductor electrodes form a second pair of semiconductor electrodes, wherein one of the first pair or the second pair of semiconductor electrodes is for receiving power and the other of the first pair or the second pair of semiconductor electrodes is for delivering power.

12. The semiconductor product as claimed in claim 11, wherein each of the first, second, third and fourth vertical insulated-gate field-effect-transistors comprises a body for providing a channel, wherein each body is a distinctly doped region of the same semiconductor material.

13. The semiconductor product as claimed in claim 11, wherein each of first, second, third and fourth switches comprises a single insulated-gate field-effect-transistor.

14. The semiconductor product as claimed in claim 11, configured as an H-bridge.

* * * * *